United States Patent
Miyazawa

(10) Patent No.: US 6,680,533 B1
(45) Date of Patent: *Jan. 20, 2004

(54) SEMICONDUCTOR DEVICE WITH SUPPRESSED RF INTERFERENCE

(75) Inventor: Naoyuki Miyazawa, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/992,688

(22) Filed: Dec. 17, 1997

(30) Foreign Application Priority Data

Mar. 19, 1997 (JP) .................................. 9-066792

(51) Int. Cl.⁷ .............................................. H01L 23/34
(52) U.S. Cl. ...................... 257/728; 257/774; 333/247
(58) Field of Search ............................ 257/774, 728; 333/247

(56) References Cited

U.S. PATENT DOCUMENTS

| | | | | |
|---|---|---|---|---|
| 5,023,624 A | * | 6/1991 | Heckaman et al. | 343/860 |
| 5,034,347 A | * | 7/1991 | Kakihana | 437/187 |
| 5,376,909 A | * | 12/1994 | Nelson et al. | 333/247 |
| 5,521,431 A | * | 5/1996 | Tahara | 257/676 |
| 5,710,523 A | * | 1/1998 | Kobayashi | 330/293 |
| 5,917,233 A | * | 6/1999 | Fryklund et al. | 257/666 |

FOREIGN PATENT DOCUMENTS

| | | |
|---|---|---|
| JP | 63-280463 | 11/1988 |
| JP | 2-148860 | 6/1990 |
| JP | 2-303152 | 12/1990 |
| JP | 3-102865 | 4/1991 |
| JP | 5-55461 | 3/1993 |

OTHER PUBLICATIONS

Kevin W. Kobayashi et al., "A Novel Monolithic HBTp–i–n–HEMT Integrated Circuit with HBT Active Feedback and p–i–n Diode Variable Gain Control", IEEE Transactions on Microwave Theory and Techniques, vol. 43, No. 5, May 1995.

Copy of Japanese Patent Application Office Action with partial translation for corresponding Japanese Patent Application 9–066792 dated Feb. 19, 2002.

* cited by examiner

Primary Examiner—Douglas A. Wille
(74) Attorney, Agent, or Firm—Armstrong, Kratz, Quintos, Hanson & Brooks, LLP

(57) ABSTRACT

A high frequency semiconductor integrated circuit device having a semiconductor chip, a package for housing the semiconductor chip and a ground conductor, comprises a first package terminal for transferring a high frequency signal; a second package terminal which is either a package terminal for transferring a high frequency signal or a package terminal for supplying current to a node at which a high frequency signal is transferred or to a drain of a transistor; a third package terminal disposed between the first and second package terminals, for applying a bias voltage to a circuit element of the integrated circuit through a first resistor; and a first capacitor disposed in the package, and having one electrode connected between the third package terminal and the first resistor and the other electrode connected to the ground conductor. The integrated circuit device provides sufficient high frequency isolation between package terminals.

15 Claims, 6 Drawing Sheets

FIG.1A
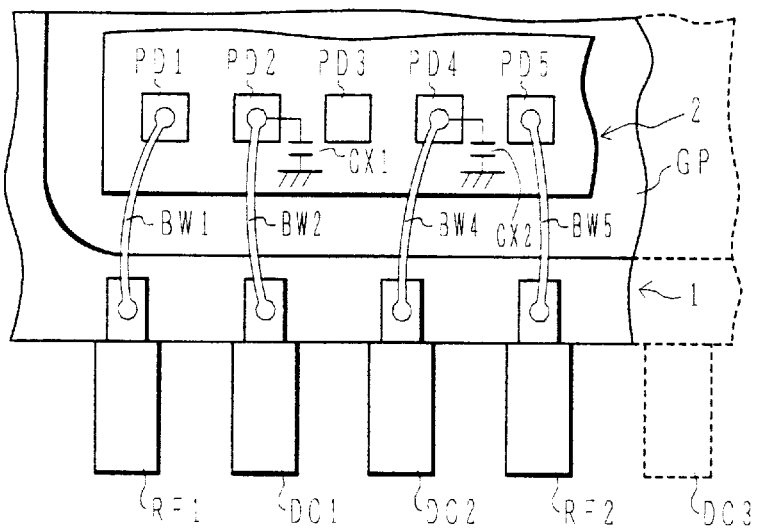
FIG.1B
FIG.1C
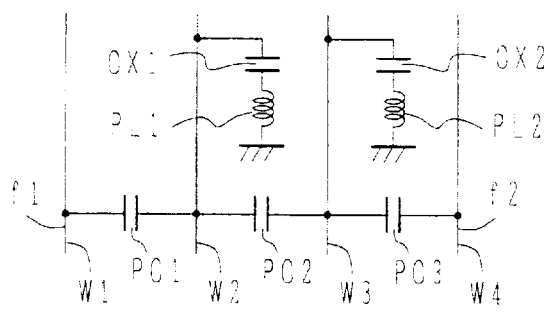
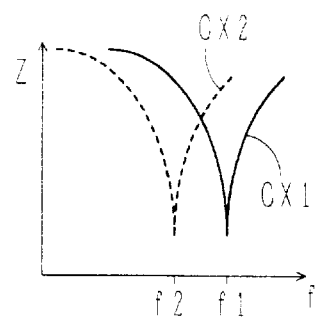
FIG.1D
FIG.1E
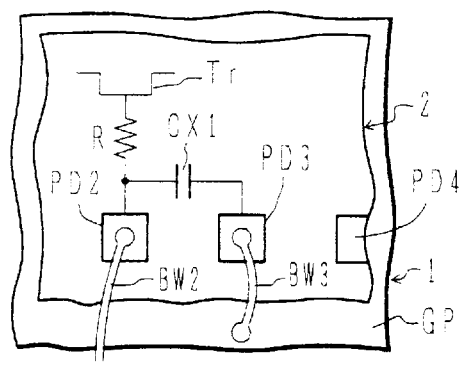
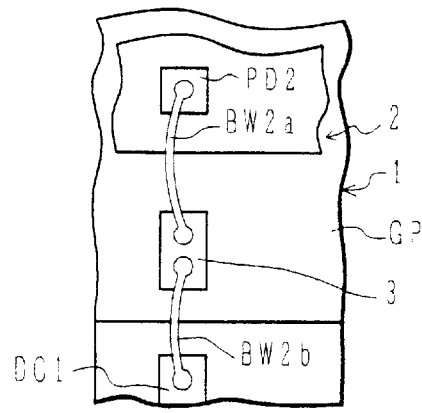

SEMICONDUCTOR DEVICE WITH SUPPRESSED RF INTERFERENCE

This application is based on Japanese Patent Application HEI-9-66792 filed on Mar. 19, 1997, the entire contents of which are incorporated herein by reference.

BACKGROUND OF THE INVENTION 1. a) Field of the Invention

The present invention relates to a high frequency semiconductor integrated circuit device, and more particularly to a high frequency semiconductor integrated circuit device housing a semiconductor integrated circuit chip in a package which has a plurality of package terminals.

2. b) Description of the Related Art

High frequency semiconductor integrated circuit devices such as microwave monolithic IC's (MMIC's) integrated with transistors such as GaAs FET's are widely used nowadays.

MMIC is mounted, for example, on a printed circuit board.

FIGS. 6A and 6B show one example of how a conventional MMIC is mounted.

Referring to FIG. 6A, a package 51 of MMIC is mounted on a printed circuit board 55. The MMIC package 51 has eight package terminals T51 to T58. The package terminal T51 is a drain bias terminal via which a bias is applied to the drain of a transistor (not shown) directly or via a coil (not shown), and is connected to a line DB on the printed circuit board 55.

The package terminal T58 is a terminal from which a d.c. bias voltage is applied to the gate of the transistor via a resistor (not shown), and is connected to a line DC on the printed circuit board 55. A high frequency signal is applied to a package terminal T55 via an input line RF1. A high frequency signal is output from a package terminal T54 to a high frequency output line RFo.

Of the eight package terminals, high frequency signals are transferred via the package terminals T55 and T54 which are located at remotest positions relative to each other. The terminals T51 and T58 to which a d.c. voltage is applied are located at remotest positions from the terminals via which high frequency signals are transferred.

The package terminals T52, T53, T56 and T57 disposed between these terminals T51, T54, T55 and T58 are connected to a ground wiring GW.

Such a circuit layout provides isolation between high frequency wirings, for example, 50 dB isolation. The terminal T51 for supplying a bias voltage to the drain is also isolated appropriately.

FIG. 6B shows another layout providing sufficient isolation. A package terminal T55 of an MMIC package 51 is a high frequency input terminal. A nearby package terminal T56 is a floating terminal which is not connected to the integrated circuit. The next package terminal T57 may be connected or not connected to the integrated circuit.

In order to isolate the package terminal T55 via which a high frequency signal is transferred, the nearby floating package terminal T56 is electrically fixed to a ground plane GP of the package.

By electrically fixing the package terminal adjacent to the high frequency transferring package terminal, to the ground plane, isolation of the high frequency transferring package terminal is attained. For example, even if a drain bias voltage or high frequency signal is applied to the package terminal T57, interference from the package terminal T56 can be reduced.

Most of the conventional MMICs have at least one input terminal and one output terminal of a high frequency signal. However, as the integration degree of a high frequency semiconductor integrated circuit chip rises, it becomes necessary to transfer high frequency signals via more package terminals or to supply bias current or voltage to more package terminals.

As the number of active package terminals in use increases, the number of remaining inactive package terminals reduces. If these active package terminals are used without any isolation, high frequency interference between these terminals becomes serious.

For example, sufficient isolation is required between a local oscillation signal having a sharp spectrum and a modulated wave in order to maintain a precision of the modulated signal, or between input and output signals having a large level difference before and after amplification in order to prevent circuit oscillation to be caused by feedback.

As described above, as the number of package terminals actually used for circuit operation of a high frequency semiconductor integrated circuit device increases, isolation between active package terminals may become insufficient.

SUMMARY OF THE INVENTION

It is an object of the present invention to provide a high frequency semiconductor integrated circuit device capable of providing sufficient isolation between package terminals even if the number of remaining package terminals not in use reduces.

According to one aspect of the present invention, there is provided a high frequency semiconductor device comprising; a semiconductor chip constituting an integrated circuit including circuit elements of at least one transistor, one resistor and one capacitor; a package for housing the semiconductor chip in an inner space defined in the package; a ground conductor formed on the package and on the semiconductor chip; a first package terminal formed on the package, a high frequency signal being transferred via the first package terminal; a second package terminal formed on the package, the second package terminal being either a package terminal via which a high frequency signal is transferred or a package terminal via which current is supplied to a node via which a high frequency signal is transferred or to a drain of a transistor; a third package terminal formed on the package and disposed between the first and second package terminals, the third package terminal applying a bias voltage to a circuit element of the integrated circuit via a first resistor; and a first capacitor disposed in the package, one electrode of the first capacitor being connected to an intermediate point between the third package terminal and the first resistor and the other electrode being connected to the ground conductor.

The third package terminal disposed between the first and second package terminals, which inevitably receive high frequency interference if they are disposed near each other, can suppress interference. If the third package terminal is not a ground terminal but a terminal which supplies a bias voltage to a circuit element via a resistor, the first and third package terminals interfere with each other in terms of high frequency, and moreover, the third and second package terminals also interfere with each other in terms of high frequency. Therefore, interference occurs between the first and second package terminals.

Since a capacitor grounded in the package is connected to the third package terminal, high frequency components leaked from the first package terminal to the third package terminal can be absorbed to the ground via the capacitor. Accordingly, high frequency interference from the first package terminal to the third package terminal can be reduced.

Similarly, high frequency interference from the second package terminal to the first package terminal can be reduced. The third package terminal is used for applying a d.c. bias voltage to a circuit element so that even if it is grounded via the capacitor in terms of high frequency via the capacitor, the function thereof is not affected.

As described above, it is possible to use as an isolation terminal the terminal for applying a voltage to the integrated circuit via a resistor. Accordingly, sufficient isolation can be ensured even for a high frequency semiconductor integrated circuit without no empty or inactive terminal.

BRIEF DESCRIPTION OF THE DRAWINGS

FIGS. 1A to 1E are diagrams for illustrating the structures of high frequency semiconductor integrated circuit devices according to embodiments of the invention.

DETAILED DESCRIPTION OF THE PREFERRED EMBODIMENTS

Figure 2A:
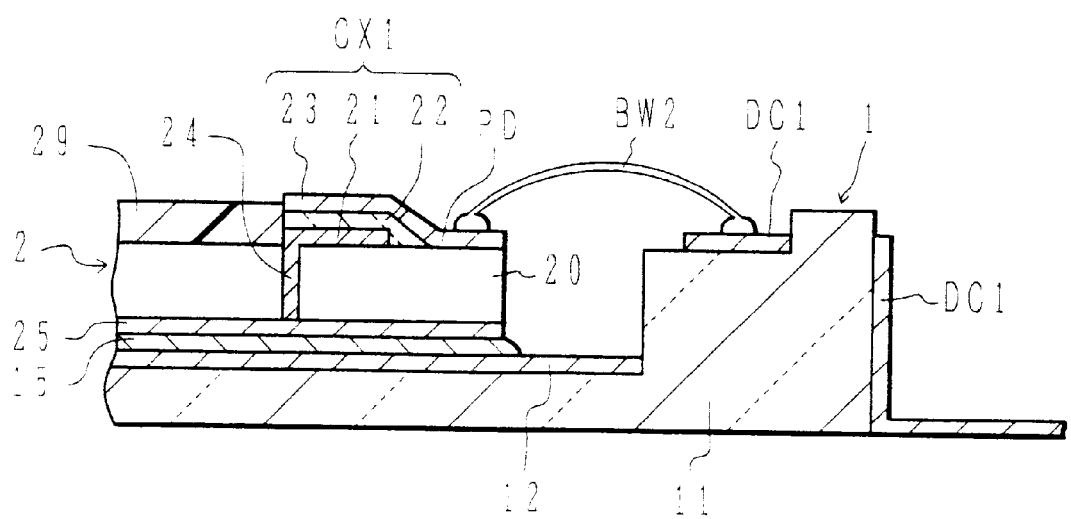
FIGS. 2A and 2B are cross sectional diagrams showing examples of the structure of a high frequency semiconductor integrated circuit device.

Embodiments of the invention will be described with reference to the accompanying drawings.

FIGS. 1A to 1E are schematic diagrams used for explaining the structure of high frequency semiconductor integrated circuit devices according to embodiments of the invention.

Referring to FIG. 1A, a package 1 has package terminals RF1, DC1, DC2, RF2, . . . and houses therein a semiconductor chip 2 with semiconductor circuits formed therein. Pads PD1, PD2, . . . are formed on the upper surface of the semiconductor chip 2.

The pad PD1 is connected by a bonding wire BW1 to the package terminal RF1. The pad PD2 is connected by a bonding wire BW2 to the package terminal DC1, and also connected via an isolation capacitor CX1 to ground. The pad PD3 is not used and is an inactive pad. The pad PD4 is connected by a bonding wire BW4 to the package terminal DC2, and also connected via an isolation capacitor CX2 to ground. The pad PD5 is connected by a bonding wire BW5 to the package terminal RF2.

The package terminals RF1 and RF2 are used, for example, for the transfer of high frequency signals. The package terminals DC1 and DC2 are used, for example, for the application of bias voltages to circuit elements such as transistors via resistors having a high resistance value of, for example, 1 kΩ or higher. The package terminals DC1 and DC2 are intended not to flow current therethrough, but to apply a d.c. voltage thereto, and are of high impedance.

FIG. 1B is an equivalent circuit diagram of package terminal portions. A wiring W1 corresponds to the wiring from the package terminal RF1 to the pad PD1. Similarly, wirings W2, W3 and W4 correspond to the wirings from the package terminals DC1, DC2 and RF2 to the pads PD2, PD4 and PD5. Since package terminals are relatively long and disposed in parallel, parasitic or stray capacitors PC1, PC2 and PC3 are formed therebetween. The capacitors PC1, PC2 and PC3 may be collectively called PC in the following. Other reference symbols may be used in a similar manner.

The parasitic capacitors PC between wirings (between package terminals) have capacitance of about 0.1 to 0.2 pF. The frequency of signals to be discussed in this specification is 500 MHz to 5 GHz, typically mobile communications frequencies of 800 MHz and 2 GHz. If capacitors CX are not connected, isolation between the wirings W1 and W4 lowers due to the parasitic capacitors PC. As the frequency becomes higher, the isolation becomes worse.

Inductance formed on the bonding wire BW is about 0.5 to 3 nH. For example, if a signal transferring via the wiring W1 has a frequency f1 and the inductance L of the bonding wire is 1 nH, a capacitor CX1 having a capacitance C as determined from $f1 = 1/[2\pi \times (LC)^{1/2}]$ is connected to the wiring W2. Therefore, a serial circuit of the high frequency ground bypass capacitor CX1 and parasitic inductor PL1 is connected between the wiring W2 and ground and signals having the high frequency f1 are grounded via very low impedance.

For example, if the inductance PL1 is 1 nH, the frequency f1 is 2 GHz and the capacitance C is 6.3 pF, then the resonance frequency is 2 GHz. Therefore, even if signals having the high frequency f1 pass through the wiring W1, these signals are efficiently grounded via the wiring W2 so that influence on the wirings W3 and W4 disposed opposite to the wiring W1 can be suppressed. If the wiring W4 is connected to the terminal via which signals having the same high frequency f1 are transferred or via which drain bias current is supplied, a capacitor CX2 having the same capacitance may be connected to the wiring W3 to further improve the isolation effects. The capacitor may be provided on at least one of the wirings W2 and W3.

If signals transferring via the wiring W4 has a frequency f2, it is preferable to connect a high frequency ground bypass capacitor CX2 to the wiring W3 to form a resonance circuit of the capacitor CX2 and a parasitic inductance PL2 having the resonance frequency f2.

FIG. 1C is a graph showing the frequency dependence characteristics of an impedance Z between the pad and ground formed by the high frequency ground bypass capacitor CX1, CX2.

In the above embodiment, a resonance circuit having a resonance frequency same as that of signals transferring via adjacent package terminals is used. It is obvious that high frequency leak can be reduced by the high frequency ground bypass capacitor even if the resonance frequency is not just the same as that of high frequency signals. Signals having a frequency near the resonance frequency can also be isolated correspondingly.

High frequency leak can be reduced considerably if the capacitor connected to the wiring has at least a fivefold capacitance or larger of the parasitic capacitor PC between adjacent package patterns, or more preferably a tenfold capacitance or larger. For example, a high frequency ground bypass capacitor of 1 pF or higher, or more preferably 2 pF or higher, is connected to a package terminal or semiconductor chip pad to be isolated.

Referring back to FIG. 1A, consider the case wherein on both sides of the package terminal RF2 via which a high frequency signal is transferred, package terminals DC2 and DC3 are disposed for applying d.c. or d.c.-like bias voltage. In this case, in order to effectively isolate high frequency signals on the package terminal RF2, it is preferably to connect high frequency ground bypass capacitors to the package terminals DC2 and DC3. It is preferable to ground high frequency signals at at least one of adjacent package terminals disposed on both sides of a package terminal via which a high frequency signal is transferred.

FIG. 1D is a schematic diagram showing one example of the way a high frequency ground bypass capacitor is connected. A pad PD2 is connected via a resistor R to the gate of a transistor Tr. In this case, the impedances of a bonding wire BW2 and a package terminal DC1 (refer to FIG. 1A) connected to the pad PD2 are high and these wire and terminal BW2 and DC1 are almost in a floating state in terms of high frequency. If the high frequency ground bypass capacitor CX1 is not connected, the package terminal RF1 and package terminal DC2 (also package terminal RF2) are almost shorted in terms of high frequency, as described before.

In this example, a high frequency ground bypass capacitor CX1 is formed on the semiconductor chip 2, one electrode of the capacitor being connected between the pad PD2 and resistor R and the other electrode being connected to the adjacent inactive pad PD3. The pad PD3 is bonded via a bonding wire BW3 to a ground plane GP at the package inner bottom surface.

FIG. 1E shows another example of a high frequency ground bypass capacitor disposed outside of the semiconductor chip. A microchip capacitor 3 and a semiconductor chip 2 are housed in a package 1. A bonding wire BW2a interconnects the bonding wire BW2a and the upper electrode of the microchip capacitor 3, and a bonding wire BW2b interconnects the upper electrode of the microchip capacitor 3 and a package terminal DC1.

FIG. 2A is a cross sectional view showing the structure of a semiconductor IC device having a high frequency ground bypass capacitor formed on a semiconductor chip, similar to the structure shown in FIG. 1D. A package 1 is an insulating container 11 made of ceramics or the like, and has an inner space for housing a semiconductor chip 2. On the inner bottom surface of the package 1, a ground conductive layer 12 is formed by plating or the like. A package terminal DC1 is formed on a shelf,of the ceramic container 11. The package terminal DC1 penetrates through the wall of the container 11 and extends downward to the bottom surface level of the container 11 and then horizontally to the outside.

The semiconductor chip 2 is disposed on the ground conductive layer 12, and has a plated layer 25 on the bottom surface thereof. A capacitor CX1 is formed on the surface of the semiconductor chip 2.

The capacitor CX1 has two parallel plate electrodes 21 and 23 between which a capacitor dielectric layer 22 is sandwiched. The upper electrode 23 is connected to a pad PD. A plated layer filling a through hole 24 formed in the semiconductor chip 2 provides a direct electrical connection between the lower electrode 21 of the capacitor CX1 and the plated layer 25 on the bottom surface of the semiconductor chip 2. The semiconductor chip 2 has an insulating layer 29 of polyimide or the like formed on the upper surface of the chip 2.

The semiconductor chip 2 having the structure described above is electrically and mechanically connected to the ground conductive layer 12 by means of a conductive adhesive layer 15. This conductive adhesive layer 15 is made of, for example, Ag paste or Au—Sn (alloy) ball.

The structure of the capacitor CX1 shown in FIG. 1D is the same as that shown in FIG. 2A, and the lower electrode 21 is connected to an adjacent pad. In this case, the through hole 24 is not formed.

Figure 2B:
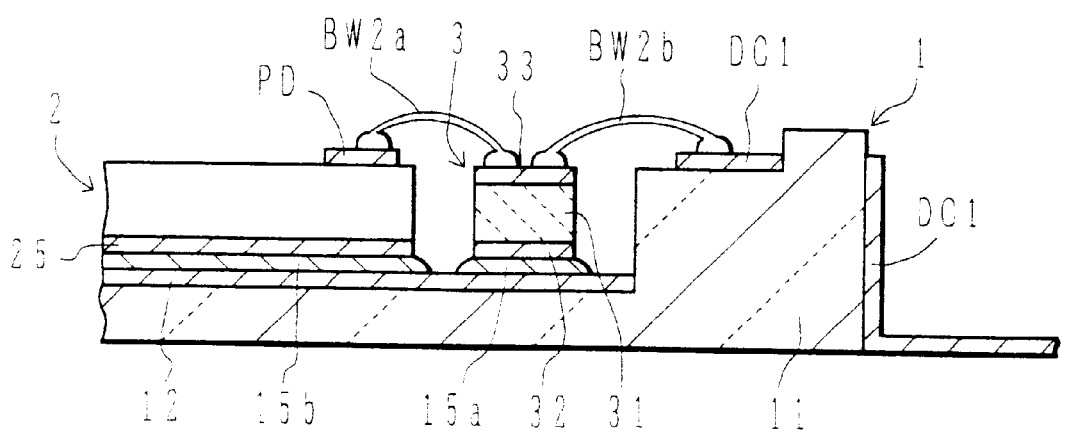

FIG. 2B is a cross sectional view showing an example of the structure of the MMIC device shown in FIG. 1E. In this structure, a microchip capacitor 3 and a semiconductor chip 2 are electrically and mechanically connected to a ground conductive layer 12 by means of conductive adhesive layers 15a and 15b. The microchip capacitor 3 has parallel plate capacitor electrode layers 32 and 33 formed by plating or the like and a capacitor dielectric layer 31 sandwiched between the electrode layers 32 and 33.

Capacitors connected to the pad PD2 have been described above. Obviously, capacitors connected to the pad PD4 can be formed in similar manners. The capacitance of each capacitor is selected in accordance with its use object.

The pad, to which a high frequency ground bypass isolation capacitor CX is connected, is used as a terminal via which a d.c. or d.c.-like bias voltage such as an output of a control logic circuit is applied through a protection or isolation resistor to a constituent element of an integrated circuit. Such a terminal is hereinafter called a DC terminal.

Figure 3A:
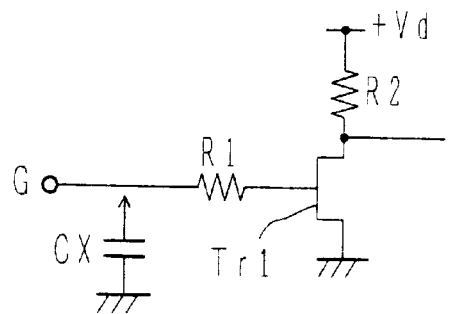
FIGS. 3A to 3C are equivalent circuit diagrams showing examples of a DC terminal.
Figure 3B:
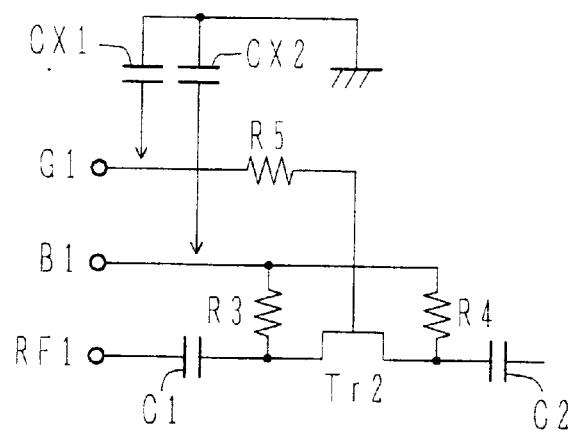
Figure 3C:
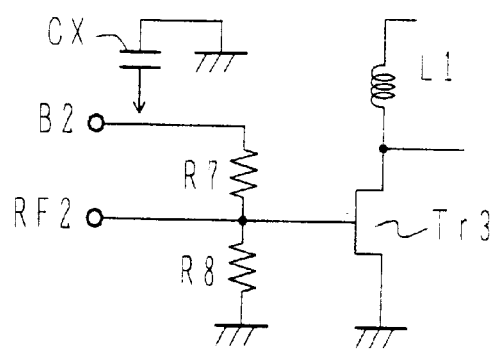

FIGS. 3A to 3C show examples of a high frequency ground bypass capacitor and a DC terminal. FIG. 3A shows an input terminal for a logical output or for a low frequency signal. A transistor Tr1 and a resistor R2 are serially connected between a voltage supply Vd and ground. A signal applied to a gate input terminal G is input via a resistor R1 to the gate of the transistor Tr1, and an output signal is derived from the drain. Depending upon the level of a signal applied to the gate electrode G, the transistor Tr1 is switched and its output is supplied to another circuit element. In this circuit structure, one electrode of a high frequency ground bypass capacitor CX is connected between the gate input terminal G and protection resistor R1, and the other electrode of the capacitor CX is grounded.

FIG. 3B shows a bias voltage applying circuit for a high frequency switching transistor. A transistor Tr2 is a switching transistor which receives a high frequency signal applied to a high frequency input terminal RF1 via a capacitor C1 and passes the received high frequency signal to another circuit element via a capacitor C2. Bias voltages are applied via resistors R3 and R4 to the source and drain of the switching transistor Tr2 from a bias terminal B1.

The gate electrode of the transistor Tr2 is connected via a resistor R5 to a gate input terminal G1. When the transistor Tr2 is turned off by a gate voltage applied to the gate input terminal G1, a high frequency signal applied to the high frequency input terminal RF1 is cut by the transistor Tr2.

In this structure, high frequency ground bypass capacitors CX1 and CX2 are connected between the gate bias voltage terminal G1 and resistor R5 and between the source/drain bias voltage terminal B1 and resistors R3 and R4.

FIG. 3C shows a gate bias structure of a high frequency transistor. A transistor Tr3 is serially connected to a coil L1. The transistor Tr3 receives at its gate electrode a high frequency signal supplied from a high frequency signal input terminal RF2, and supplies a high frequency output from its drain to another circuit element.

A serial circuit of resistors R7 and R8 is used for applying a d.c. bias voltage to the gate electrode of the transistor Tr3.

A d.c. voltage is applied to a bias input terminal B2. A voltage between this bias voltage supply terminal B2 and ground is divided by the resistors R7 and R8. The divided voltage is applied as a bias voltage to the gate electrode of the transistor Tr3.

In this structure, a high frequency ground bypass capacitor CX is connected to the gate bias input terminal B2. In the circuits described above, the values of the resistors R1, R3, R4, R5, R7 and R8 are generally 1 kΩ or higher, for example, about 2 kΩ.

Figure 4A:
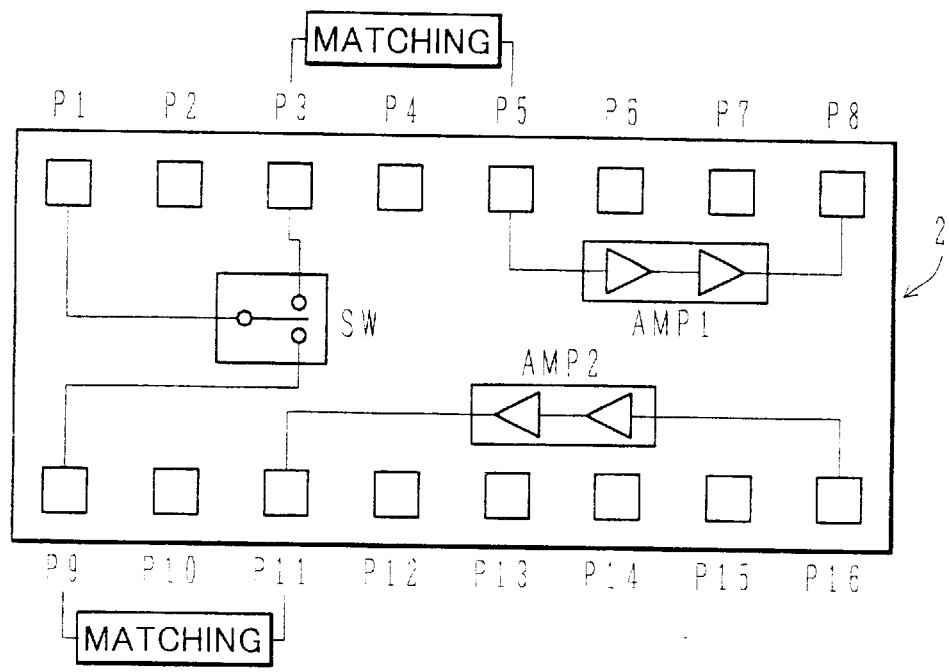
FIGS. 4A to 4C are a plan view and equivalent circuit diagrams showing examples of an MMIC chip.
Figure 4B:
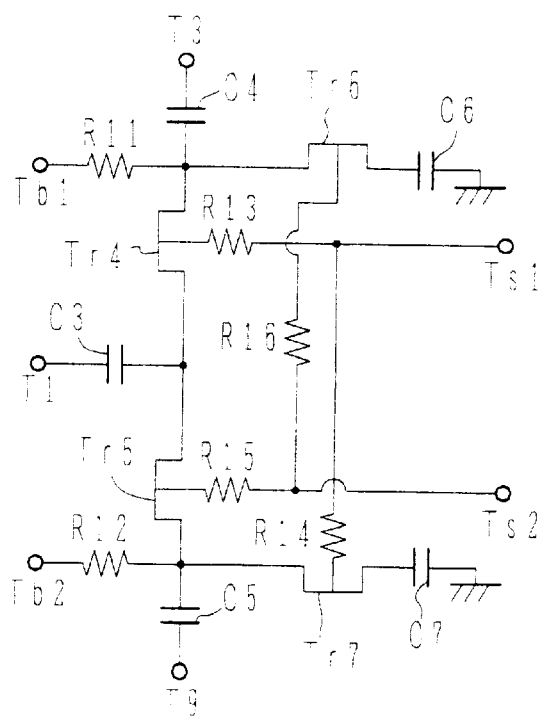
Figure 4C:
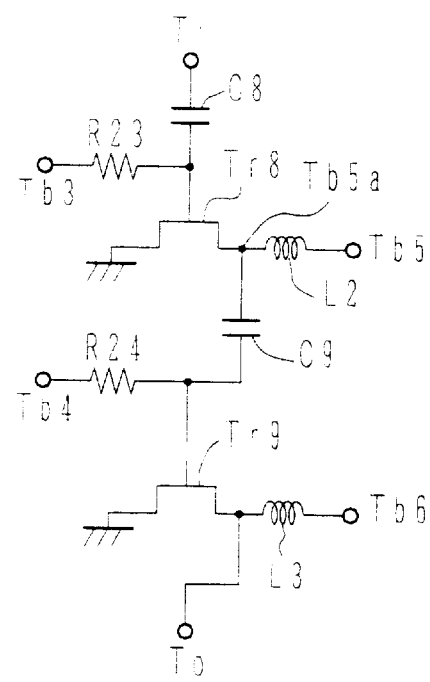

FIGS. 4A to 4C show more specific examples of the structure of an MMIC device.

As shown in FIG. 4A, a semiconductor IC chip 2 has sixteen pads P1 to P16. Formed in this semiconductor chip are a switching circuit SW and amplifier circuits AMP1 and AMP2. A common contact of the switching circuit SW is connected to the pad P1 and its select contacts are connected to the pads P3 and P9. The input and output terminals of the amplifier AMP1 are connected to the pads P5 and P8. The input and output terminals of the other amplifier AMP2 are connected to the pads P11 and P16. A matching circuit is externally connected between the pads P3 and P5, and another matching circuit is externally connected between the pads P9 and P11.

A high frequency signal applied to the pad P16 is amplified by the amplifier AMP2 and may be output via the switch circuit SW from the pad P1. A high frequency signal applied to the pad P1 may be supplied via the switching circuit SW to the pad P3 and to the pad P5, amplified by the amplifier AMP1, and output from the pad P8.

FIG. 4B shows an example of the structure of the switching circuit SW. Terminals T1, T3 and T9 are connected to the pads P1, P3 and P9. The other terminals Tb1, Tb2, Ts1 and Ts2 are connected to suitable pads shown in FIG. 4A although the connection is not shown.

Between the terminals T3 and T9, a serial circuit is connected which includes a capacitor C4, transistors Tr4 and Tr5 and a capacitor C5. An interconnection point between the capacitor C4 and transistor Tr4 is connected via a resistor R11 to the terminal Tb1 and grounded via a transistor Tr6 and a capacitor C6. Similarly, an interconnection point between the capacitor C5 and transistor Tr5 is connected via a resistor R12 to the terminal Tb2 and grounded via a transistor Tr7 and a capacitor C7.

A control voltage is applied from the terminal Ts1 to the gate electrode of the transistor Tr4 via a resistor R13, and to the gate electrode of the transistor Tr7 via a resistor R14. The terminal Ts2 is connected via a resistor R15 to the gate of the transistor Tr5, and via a resistor R16 to the gate of the transistor Tr6.

As a pull-down voltage is applied to the terminal Ts1, the transistors Tr4 and Tr7 turn off so that the terminals T1 and T9 are electrically connected in terms of high frequency.

As a pull-down voltage is applied to the terminal Ts2, the transistors Tr5 and Tr6 turn off so that the terminals T1 and T3 are electrically connected in terms of high frequency.

In this structure, the terminals T1, T3 and T9 are high frequency terminals via which high frequency signals are transferred. The terminals Tb1 and Tb2 are drain bias terminals via which a bias voltage is applied to the drain or source of each transistor, and become DC terminals if the resistance values of the resistors R11 and R12 are high (e.g., 1 kΩ or higher). The terminals Ts1 and Ts2 are DC terminals via which outputs of the logical circuit are applied. For example, in the case where the terminals Ts1 and Ts2 are connected to the pads P2 and P10, one electrodes of high frequency ground bypass capacitors are connected to these terminals Ts1 and Ts2, and the other electrodes thereof are grounded. High frequency ground bypass capacitors may also be connected to the terminals Tb1 and Tb2.

FIG. 4C shows an example of the structure of the amplifier circuit AMP1 or AMP2. A transistor Tr8 and a coil L2 are connected between a terminal Tb5 and ground and constitute an amplification stage. The gate of the transistor Tr8 is connected via a capacitor C8 to a high frequency signal input terminal Ti, and via a protection resistor R23 to a DC terminal Tb3.

An interconnection point between the transistor Tr8 and coil L2 is connected via a capacitor C9 to the gate of a transistor Tr9. A serial circuit of the transistor Tr9 and a coil L3 is connected between a terminal Tb6 and ground. The gate electrode of the transistor Tr9 is connected via a resistor R24 to a DC terminal Tb4. An interconnection point between the transistor Tr9 and coil L3 is connected to a high frequency signal output terminal To.

A high frequency signal applied to the high frequency signal input terminal Ti is amplified by the transistors Tr8 and Tr9 and transferred to the high frequency signal output terminal To. The terminals Tb3 and Tb4 are DC terminals via which bias voltages are applied to the gates of the transistors Tr8 and Tr9 via the protection resistors. The terminals Tb5 and Tb6 are drain bias terminals via which drain currents are supplied to the transistors via the coils.

In the case when matching circuits are constituted by externally connecting capacitors to these drain bias terminals Tb5 and Tb6, high frequency signals are not completely shut out by the coils L2 and L3, and isolation of high frequency signals is necessary at the terminals Tb5 and Tb6. If the coil L2 is connected externally and a terminal Tb5a is used as the package terminal, the drain bias terminal becomes the RF terminal and isolation is necessary.

More specifically, in the case of the amplifier circuit AMP1, the DC terminals Tb3 and Tb4 for controlling the transistors are connected to some of the pads P4, P6 and P7 shown in FIG. 4A. In this case, irrespective of how the DC terminals Tb3 and Tb4 are connected to the pads, high impedance terminals exist between the two terminals through which a high frequency signal passes. Therefore, a high frequency ground bypass capacitor is required to be connected to one of the pads P6 and P7. Another high frequency ground bypass capacitor is also connected to the terminal T4 for the isolation between the terminals P3 and P5. In the case of the amplifier circuit AMP2, high frequency ground bypass capacitors are connected to the pad P10 and to one of the pads P12 to P15. If the inductance of a bonding wire is 1.5 nH and the frequency is 1.9 GHz, the capacitance of a high frequency ground bypass capacitor is preferably 4.7 pF.

Figure 5A:
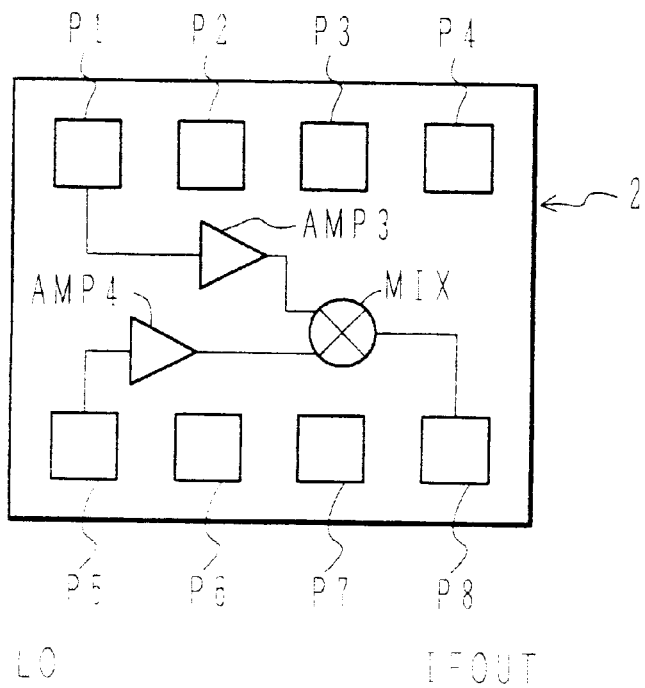
FIGS. 5A and 5B are a plan view and an equivalent circuit diagram showing an example of an MMIC chip.
Figure 5B:
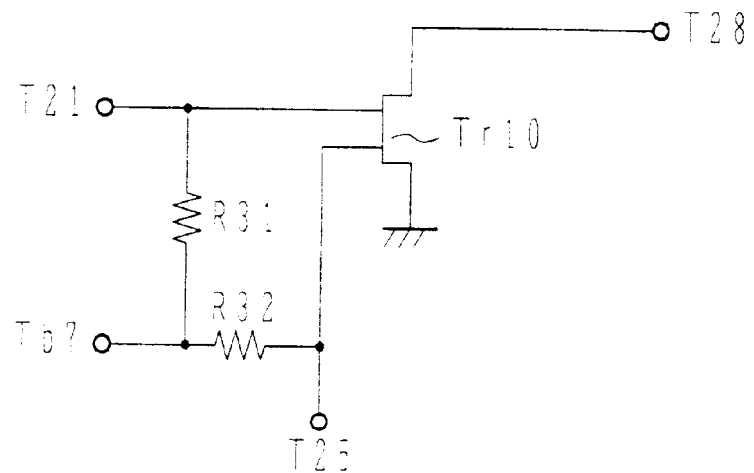
Figure 6A:
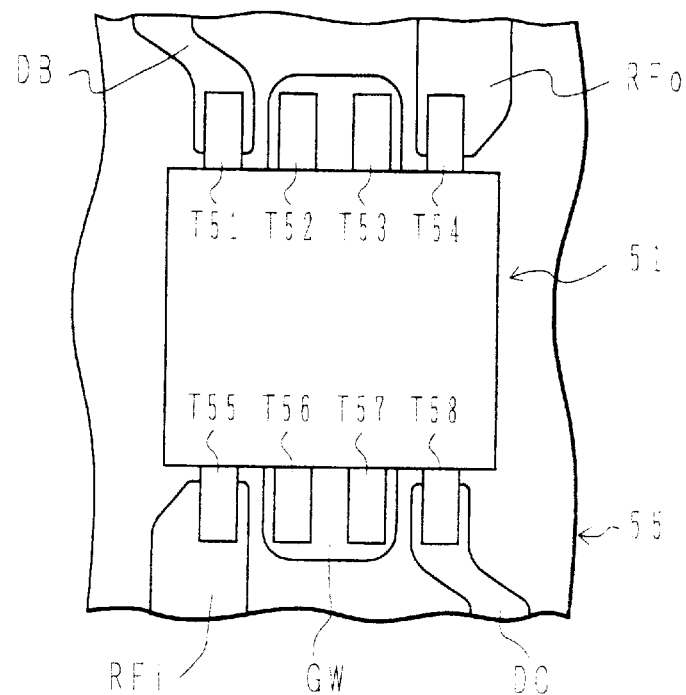
FIGS. 6A and 6B are plan views showing layouts of conventional MMIC chips.
Figure 6B:
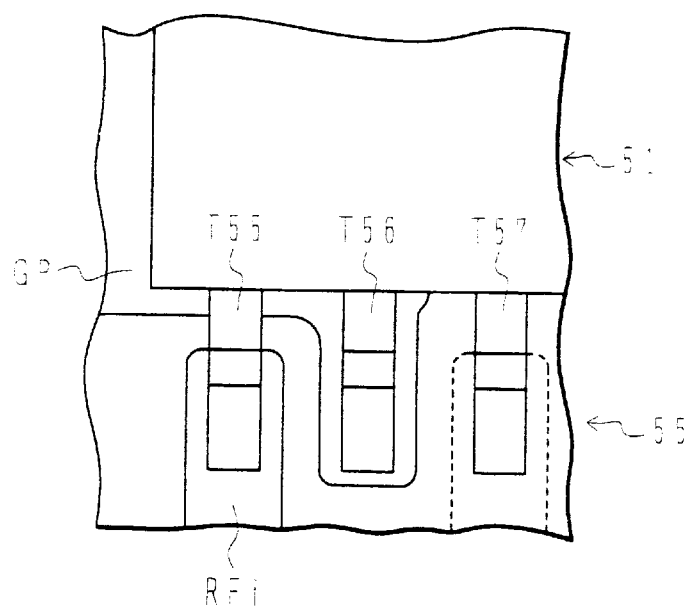

FIGS. 5A and 5B show an example of the structure of an MMIC mixer circuit. An MMIC chip 2 has eight pads P1 to P8. The pads P1 and P5 are connected to amplifiers AMP3 and AMP4. The outputs of these amplifiers AMP3 and AMP4 are supplied to a mixer circuit MIX. An output of the mixer circuit MIX is supplied to the pad P8. A high frequency signal RFIN having a frequency of, for example, 1.9 GHz is applied to the pad P1. A signal LO having a relatively low frequency of, for example, 1.6 GHz is applied to the pad P5. Therefore, an intermediate frequency output IFOUT having a frequency of 300 MHz is supplied to the pad P8.

FIG. 5B is an equivalent circuit of the mixer circuit MIX. A transistor Tr10 has two gate electrodes, one gate electrode being connected to a terminal T21 and the other gate electrode being connected to a terminal T25. Bias voltages are applied to these gates from a terminal Tb7 via resistors R31 and R32. The drain of the transistor Tr10 is connected to an output terminal T28. In this structure, the terminal Tb7 for supplying bias voltages to the gate electrodes is a DC terminal. Therefore, a high frequency ground bypass capacitor is connected to the pad which is connected to the terminal Tb7.

In the structure shown in FIG. 5A, it is necessary to provide sufficient isolation between the pads P5 and P8. Therefore, a high frequency ground bypass capacitor is connected to one of the pads P6 and P7.

If the frequency of a signal applied to the pad P5 is 1.6 GHz and the inductance of a bonding wire is 1.5 nH, then a capacitor having a capacitance of 6.6 pF is preferably connected to at least one of the pads P6 and P7.

The present invention has been described in connection with the preferred embodiments. The invention is not limited only to the above embodiments. It will be apparent to those skilled in the art that various modifications, improvements, combinations, and the like can be made.

What is claimed is:

1. A high frequency semiconductor device comprising:
   a semiconductor chip constituting an integrated circuit including circuit elements of at least one transistor, one resistor and one capacitor;
   a package for housing said semiconductor chip in an inner space defined in said package;
   a ground conductor formed on said package and on said semiconductor chip;
   a first package terminal formed on said package and connected to one of said circuit elements either directly or through a capacitor, a high frequency signal being transferred via said first package terminal;
   a second package terminal formed on said package and connected to another of said circuit elements directly or through a capacitor or a coil, said second package terminal being either a package terminal via which a high frequency signal is transferred or a package terminal via which current is supplied to said another circuit element via which a high frequency signal is transferred or to a drain of a transistor;
   a third package terminal, not directly grounded, formed on said package and disposed between said first and second package terminals in such a manner that there is no package terminal directly connected to the ground conductor between said first and third package terminals and between said second and third package terminals, said third package terminal having a wiring inductance being connected to a gate of a transistor through a resistor and adapted for receiving a logical voltage signal or a low frequency voltage signal and applying it to said gate of the transistor; and
   a first capacitor disposed in said package, one electrode of said first capacitor being connected between said third package terminal and said resistor and the other electrode being connected to said ground conductor, the first capacitor having a first capacitance which constitutes resonance with said wiring inductance in an RF frequency range, thereby connecting said third package terminal to the ground at high frequencies, transferring resonance frequencies of the high frequency signal to the ground, and isolating said first and second package terminals,
   wherein said third package terminal forms an RF interference blocking means for blocking RF interference between said first package terminal and said second package terminal.

2. A high frequency semiconductor device according to claim 1, wherein said first capacitor is formed on said semiconductor chip.

3. A high frequency semiconductor device according to claim 2, wherein said semiconductor chip has a through hole formed therein, said ground conductor includes a ground plane formed on an inner bottom surface of the space of said package and a conductor filling the through hole and electrically connecting the other electrode of said first capacitor and the ground plane.

4. A high frequency semiconductor device according to claim 1, wherein said ground conductor includes a ground plane formed on an inner bottom surface of the space of said package and the other electrode of said first capacitor is a planar conductive layer mechanically and electrically adhered to the ground plane.

5. A high frequency semiconductor device according to claim 1, wherein the frequency of the high frequency signal transferred via said first package terminal is f1, and said first capacitor and a parasitic inductance of a connection wire constitute a resonance circuit having a resonance frequency near the frequency f1.

6. A high frequency semiconductor device according to claim 1, further comprising a fourth package terminal disposed between said first and second package terminals.

7. A high frequency semiconductor device according to claim 6, wherein said second package terminal is a package terminal via which a high frequency signal is transferred, and said fourth package terminal is disposed between said third and second package terminals and applies a bias voltage to a circuit element of the integrated circuit through a second resistor.

8. A high frequency semiconductor device comprising:
   a semiconductor chip constituting an integrated circuit including circuit elements of at least one transistor, one resistor and one capacitor;
   a package for housing said semiconductor chip in an inner space defined in said package;
   a ground conductor formed on said package and on said semiconductor chip;
   a first package terminal formed on said package and connected to one of said circuit elements either directly or through a capacitor, a high frequency signal being transferred via said first package terminal;
   a second package terminal formed on said package and connected to another of said circuit elements directly or through a capacitor or a coil, said second package terminal being either a package terminal via which a high frequency signal is transferred or a package terminal via which current is supplied to said another circuit element via which a high frequency signal is transferred or to a drain of a transistor;
   a third package terminal, not directly grounded, formed on said package and disposed between said first and second package terminals in such a manner that there is no package terminal directly connected to the ground conductor between said first and third package terminals and between said second and third package terminals, said third package terminal having a wiring inductance and being connected to a gate of a transistor through a first resistor and adapted for receiving a logical voltage signal or a low frequency voltage signal and applying it to said gate of the transistor;

a first capacitor disposed in said package, one electrode of said first capacitor being connected between said third package terminal and said resistor and the other electrode being connected to said ground conductor, the first capacitor having a first capacitance which constitutes resonance with said wiring inductance in an RF frequency range, thereby connecting said third package terminal to the ground at high frequencies, transferring resonance frequencies of the high frequency signal to the ground, and isolating said first and second package terminals;

a fourth package terminal disposed between said first and second package terminals, wherein said second package terminal is a package terminal via which a high frequency signal is transferred, and said fourth package terminal is disposed between said third and second package terminals and applies a bias voltage to a circuit element of the integrated circuit through a second resistor; and a second capacitor disposed in said package, one electrode of said second capacitor being connected between said fourth package terminal and said second resistor, the other electrode of said second capacitor being connected to said ground conductor, wherein said third package terminal and said fourth package terminal form an RF interference blocking means for blocking RF interference between said first package terminal and said second package terminal.

9. A high frequency semiconductor device according to claim 8, wherein said second capacitor is formed on said semiconductor chip.

10. A high frequency semiconductor device according to claim 9, wherein said semiconductor chip has a through hole formed therein, said ground conductor includes a ground plane formed on an inner bottom surface of the space of said package and a conductor filling the through hole and electrically connecting the other electrode of said first capacitor and the ground plane.

11. A high frequency semiconductor device according to claim 8, wherein said ground conductor includes a ground plane formed on an inner bottom surface of the space of said package and the other electrode of said first capacitor is a planar conductive layer mechanically and electrically adhered to the ground plane.

12. A high frequency semiconductor device according to claim 8, wherein the frequency of the high frequency signal transferred through said first package terminal is f1, and said first capacitor and a parasitic inductance of a connection wire constitute a resonance circuit having a resonance frequency near the frequency f1.

13. A high frequency semiconductor device according to claim 12, wherein said second package terminal is a package terminal through which a high frequency signal having a frequency f2 is transferred, and said second capacitor constitutes a resonance circuit having a resonance frequency near the frequency f2.

14. The high frequency semiconductor device as recited in claim 1, wherein said first capacitor is separately formed outside said semiconductor chip.

15. The high frequency semiconductor device as recited in claim 1, further comprising a fourth package terminal formed on said package and connected to ground through a capacitor to suppress RF interference.

* * * * *